United States Patent
Son et al.

(10) Patent No.: US 9,984,784 B2
(45) Date of Patent: May 29, 2018

(54) GLASS FRIT, AND CONDUCTIVE PASTE COMPOSITION AND SOLAR CELL COMPRISING THE SAME

(71) Applicant: HANWHA CHEMICAL CORPORATION, Seoul (KR)

(72) Inventors: Won Il Son, Seoul (KR); You-Jin Sim, Daejeon (KR); Choong-Hoon Paik, Daejeon (KR); Mi-Kyoung Kim, Seoul (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 191 days.

(21) Appl. No.: 14/987,766

(22) Filed: Jan. 5, 2016

(65) Prior Publication Data
US 2016/0141066 A1    May 19, 2016

Related U.S. Application Data

(62) Division of application No. 14/371,669, filed as application No. PCT/KR2013/000246 on Jan. 11, 2013, now abandoned.

(30) Foreign Application Priority Data

Jan. 13, 2012    (KR) .................. 10-2012-0004387

(51) Int. Cl.
*H01B 1/02*    (2006.01)
*H01B 1/22*    (2006.01)
(Continued)

(52) U.S. Cl.
CPC ............ *H01B 1/02* (2013.01); *C01G 23/005* (2013.01); *C01G 33/006* (2013.01); *C03C 3/07* (2013.01);
(Continued)

(58) Field of Classification Search
CPC ... H01B 1/02; H01B 1/14; H01B 1/16; H01B 1/20; H01B 1/22; H01L 31/0224;
(Continued)

(56) References Cited

U.S. PATENT DOCUMENTS 7,517,632 B2 *    4/2009    Sasaki ................. C08F 2/50
                                                         430/198
2008/0314444 A1 *  12/2008  Kawaguchi ........... C03C 8/18
                                                         136/256
(Continued)

*Primary Examiner* — Harold Pyon
*Assistant Examiner* — Matthew R Diaz
(74) *Attorney, Agent, or Firm* — Lex IP Meister, PLLC

(57) ABSTRACT

The present invention relates to a glass frit, a conductive paste composition comprising the glass frit, and a solar cell fabricated using the conductive paste composition. The glass frit of the present invention comprises $SiO_2$, PbO, and at least one selected from the group consisting of $Al_2O_3$, $ZrO_2$, ZnO, and $Li_2O$. Further, the conductive paste composition of the present invention comprises a silver (Ag) powder, a lithium titanium oxide, a glass frit, a binder, and a solvent. The conductive paste composition of the present invention can be used to provide a solar cell having low contact resistance to enhance photoelectric efficiency.

9 Claims, 1 Drawing Sheet

(51) Int. Cl.
- *C01G 23/00* (2006.01)
- *C03C 3/07* (2006.01)
- *C03C 3/074* (2006.01)
- *C03C 8/10* (2006.01)
- *C03C 8/12* (2006.01)
- *C03C 8/16* (2006.01)
- *C03C 8/20* (2006.01)
- *C04B 35/462* (2006.01)
- *H01L 31/0224* (2006.01)
- *H05K 1/09* (2006.01)
- *C03C 8/18* (2006.01)
- *C01G 33/00* (2006.01)

(52) U.S. Cl.
CPC ............... *C03C 3/074* (2013.01); *C03C 8/10* (2013.01); *C03C 8/12* (2013.01); *C03C 8/16* (2013.01); *C03C 8/18* (2013.01); *C03C 8/20* (2013.01); *C04B 35/462* (2013.01); *H01B 1/22* (2013.01); *H01L 31/022425* (2013.01); *H05K 1/092* (2013.01); *C01P 2002/54* (2013.01); *C01P 2004/03* (2013.01); *C01P 2004/62* (2013.01); *C01P 2004/64* (2013.01); *C04B 2235/3201* (2013.01); *C04B 2235/3203* (2013.01); *C04B 2235/3251* (2013.01); *C04B 2235/5445* (2013.01); *C04B 2235/5454* (2013.01); *Y02E 10/50* (2013.01)

(58) Field of Classification Search
CPC ... H01L 31/022425; C03C 3/062; C03C 3/07; C03C 3/072; C03C 3/074; C03C 3/076; C03C 3/078; C03C 3/083; C03C 3/085; C03C 3/087; C03C 3/089; C03C 3/091; C03C 3/093; C03C 3/102; C03C 3/105; C03C 3/108; C03C 8/10; C03C 8/12; C03C 8/16; C03C 8/18; C03C 8/20; C01G 23/003; C01G 23/005; C04B 35/46; C04B 35/462; C09D 5/24; C09D 11/52; H05K 1/092; H05K 1/095; H05K 1/097

See application file for complete search history.

(56) References Cited

U.S. PATENT DOCUMENTS

2011/0147677 A1*  6/2011  Carroll ................ C03C 3/07
                                          252/519.3
2011/0232746 A1*  9/2011  Carroll ................ B22F 1/0059
                                          136/256

\* cited by examiner

GLASS FRIT, AND CONDUCTIVE PASTE COMPOSITION AND SOLAR CELL COMPRISING THE SAME

CROSS-REFERENCES TO RELATED APPLICATION

This application is a Divisional Application of U.S. patent application Ser. No. 14/371,669 filed on Jul. 10, 2014, which is a National Stage application of PCT/KR2013/000246 filed on Jan. 11, 2013, which claims priority to Korean Patent Application No. KR 10-2012-0004387 filed on Jan. 13, 2012, the contents of which are incorporated herein by reference.

FIELD OF THE INVENTION

The present invention relates to a glass frit, and a conductive paste composition and a solar cell comprising the same and, more particularly to a glass frit, and a conductive paste composition and a solar cell comprising the same that exhibit low contact resistance and high efficiency.

This application claims priority to and the benefit of Korean Patent Application No. 10-2012-0004387 filed on Jan. 13, 2012, the contents of which are incorporated herein by reference.

BACKGROUND OF ART

Interest in alternative energy sources is rising along with the forecasts on the steady depletion of energy sources, such as petroleum or charcoal. Among the alternative energy sources, the solar cells are catching on as a next-generation cell technology using a semiconductor device for converting solar energy directly into electricity. The solar cells are largely classified into silicon solar cells, compound semiconductor solar cells, and tandem solar cells. Silicon solar cells are by far the predominant technology.

For high efficiency of the silicon solar cells, there have been developed a variety of technologies, such as shallow emitters, selective emitters, or the like. The term "shallow emitter" as used herein refers to an emitter layer with high sheet resistance of 60 to 120 Ω/sq. Such a shallow emitter features some advantages, such as having low recombination rate and using short-wavelength sun light.

The emitter layer formed on the substrate in the crystalline silicon solar cell has a pn junction using the substrate as a base. The high Rs cell has high photoelectric conversion efficiency, since it has a relatively high sheet resistance of 60 to 120 Ω/sq with respect to the conventional crystalline solar cells of which the emitter layer has a sheet resistance of 40 to 50 Ω/sq. In other words, the high-efficiency solar cells are designed to have enhanced efficiency by reducing the potential portion of the dead layer (i.e., the region where the electrons produced by the solar cell are inhibited from forming the electrical current due to the surplus semiconductor impurity concentration) on the surface layer among the emitter layers formed on the front surface of the solar cell substrate.

In such a high-efficiency solar cell, the emitter layer may have a thickness of 100 nm to 500 nm and a semiconductor impurity concentration of $1\times10^{16}$ to $1\times10^{21}$ atom/cm$^3$. In the fabrication method for the conventional solar cells, the emitter is formed to have such a small thickness as of an ultrathin type and doped with a low concentration of semiconductor impurities.

In contrast to the regular solar cell having an emitter layer with a thickness of at least 600 nm, the high-efficiency solar cell has an ultrathin emitter layer 100 nm to 500 nm in thickness and thus potentially encounters a problem that its electrode during formation gets in contact with the base substrate as passing through the ultrathin emitter layer, ending up with occurrence of short-circuit. In other words, to put the high-efficiency solar cells having an ultrathin emitter layer into commercial uses, there is a need for a process not only to facilitate a contact of the thin emitter layer but to make the electrode out of contact with the silicon substrate which acts as a base, thereby preventing occurrence of short-circuit.

The silver (Ag) paste has been used to form a front surface electrode of the ultrathin emitter. The silver paste contains a silver powder, an organic binder, glass frits, and so forth. However, the existence of glass frits in the silver paste results in poor Ohmic contact and, worse, occurrence of short-circuit. Particularly, a high-temperature process at about 800° C. for a short period is necessary in forming a contact region of the front surface electrode. A failure to precisely control the high-temperature process potentially ends up with high serial resistance or low shunt resistance.

Conventionally, the silver paste has been prepared simply by mixing silver powder with glass frits and/or optionally metal oxides as an inorganic additive, but with limitation in the inhibitory effect on the resistance between the formed electrode and the substrate. Thus, there is still a difficulty in achieving high efficiency when applying the silver paste to the electrode.

For example, a paste composition comprising zinc oxide as an inorganic additive to form a front surface electrode is disclosed in US Patent Application No. 20080223446. The cited patent describes a conductive paste containing a glass frit and 7- to 100 nm-diameter ZnO as an inorganic additive, where the glass frit comprises 21 to 29 wt % of $SiO_2$, 0.1 to 8 wt % of $Al_2O_3$, 50 to 62 wt % of PbO, 7 to 10 wt % of $B_2O_3$, 0 to 4 wt % of ZnO, 0 to 0.1 wt % of $Li_2O$, and 2 to 7 wt % of $TiO_2$. However, the front surface electrode using the paste composition disclosed in the cited document has some problems that it has unsatisfactory "fired-through" state with the SiN film mainly used as an anti-reflection layer for solar cells and exhibits high serial resistance, thus making it difficult to provide high-efficiency solar cells.

DISCLOSURE OF THE INVENTION

Summary of the Invention

To solve the problems with the prior art, it is an object of the present invention to provide a glass frit having a novel composition.

It is another object of the present invention to provide a conductive paste composition comprising the glass frit and having a low contact resistance.

It is still another object of the present invention to provide a solar cell fabricated using the conductive paste composition.

To achieve the objects, the present invention provides a glass frit comprising $SiO_2$, PbO, and at least one selected from the group consisting of $Al_2O_3$, $ZrO_2$, ZnO, and $Li_2O$.

The present invention also provides a conductive paste composition comprising a silver (Ag) powder, a lithium titanium oxide, a glass frit, a binder, and a solvent.

The present invention also provides a solar cell comprising: a substrate having a first conductivity; an emitter layer having a second conductivity and being formed on the substrate; an anti-reflection layer formed on the emitter layer; a front surface electrode being connected to the emitter layer as passing through the anti-reflection layer and prepared using the conductive paste composition; and a back surface electrode formed on the back surface of the substrate.

The present invention can provide a solar cell having low contact resistance to enhance photovoltaic efficiency.

DESCRIPTION OF REFERENCE NUMERALS

Figure 1:
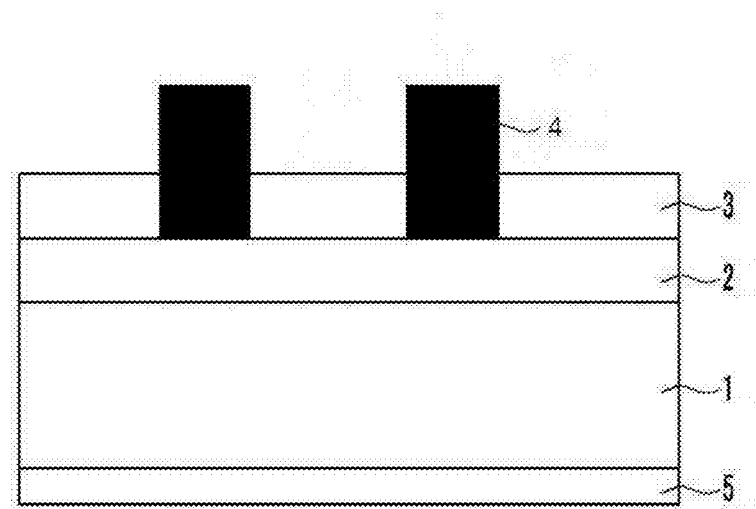
FIG. 1 is a cross-sectional view showing the structure of a solar cell according to one embodiment of the present invention.

1: substrate
2: emitter layer
3: anti-reflection layer
4: front surface electrode
5: back surface electrode

DETAILED DESCRIPTION OF THE INVENTION

In accordance with one embodiment of the present invention, there is provided a glass frit comprising $SiO_2$, PbO, and at least one selected from the group consisting of $Al_2O_3$, $ZrO_2$, ZnO, and $Li_2O$.

In accordance with another embodiment of the present invention, there is provided a conductive paste composition comprising a silver (Ag) powder, a lithium titanium oxide, the glass frit, a binder, and a solvent.

In accordance with still another embodiment of the present invention, there is provided a solar cell comprising: a substrate having a first conductivity; an emitter layer having a second conductivity and being formed on the substrate; an anti-reflection layer formed on the emitter layer; a front surface electrode being connected to the emitter layer as passing through the anti-reflection layer and prepared using the conductive paste composition; and a back surface electrode formed on the back surface of the substrate.

It will be understood that, although the terms "first", "second", etc. may be used herein to describe various elements, they are only used to distinguish one element from another.

It will also be understood that when a layer or an element is referred to as being "on" or "upon" another layer or element, it can be directly on the other layer or element, or intervening layers or elements may be present therebetween.

While example embodiments of the present invention are susceptible to various modifications and alternative forms, specific embodiments thereof will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention.

Hereinafter, a detailed description will be given as to a glass frit, and a conductive paste composition and a solar cell comprising the same according to the present invention with reference to the accompanying drawings.

Glass Frit

The glass frit of the present invention comprises at least one selected from the group consisting of $Al_2O_3$, $ZrO_2$, ZnO, and $Li_2O$, in combination with $SiO_2$ and PbO.

The glass frit is used to effectively form an electrode in a fired pattern deprived of pin holes. The glass frit of the present invention includes, as well as $SiO_2$ and PbO, at least one metal oxide selected from the group consisting of $Al_2O_3$, $ZrO_2$, ZnO, and $Li_2O$.

More specifically, in accordance with one embodiment of the present invention, the glass frit may comprise 5 to 30 wt % of $SiO_2$, 50 to 90 wt % of PbO, 0.1 to 10 wt % of $Al_2O_3$, and 0.1 to 10 wt % of $ZrO_2$.

In accordance with another embodiment of the present invention, the glass frit may comprise 5 to 30 wt % of $SiO_2$, 50 to 90 wt % of PbO, 0.1 to 10 wt % of $Al_2O_3$, 0.1 to 10 wt % of $ZrO_2$, 0.1 to 10 wt % of ZnO, and 0.1 to 10 wt % of $Li_2O$.

In the conductive paste composition of the present invention, the components of the glass frit, such as $Al_2O_3$, $ZrO_2$, ZnO, and $Li_2O$, are not only to form a stable glass phase in the interface reaction but to maintain low viscosity. The low viscosity of the glass component in the interface reaction enhances the possibility that PbO gets in contact with the anti-reflection layer, allowing etching to occur in the larger area. The etching in a relatively large area leads to an increase in the region for the front surface electrode formed by recrystallization of silver, which lowers the contact resistance between the substrate and the front surface electrode to enhance the performance of the resultant solar cell and furthermore improve the contact strength between the substrate and the front surface electrode.

In accordance with one embodiment of the present invention, the glass frit may have an average particle diameter (D50) in the range of about 0.5 to about 10 μm, /preferably about 0.8 to about 5 μm. The average particle size of the glass frit within the above-defined range leads to formation of the electrode in a fired pattern deprived of pin holes with effectiveness.

Beside the aforementioned components, another components typically used in the glass frit may be further added. For example, the glass frit may further comprise, if not specifically limited to, $Na_2O$.

The components of the glass frit of the present invention are melted together. The step of melting the components of the glass frit according to one embodiment of the present invention is conducted to disconnect the bonding between the molecules in the individual components to lose the properties peculiar to the metal oxide, so that the melted components are homogeneously mixed together to provide the vitric properties through the subsequent cooling step. In the melting step, the melting temperature may be selected without specific limitation as the temperature at which all the individual components are sufficiently melted. For example, the melting temperature may be, if not specifically limited to, about 900 to about 1,500° C. Further, the melting time may be determined, without specific limitation, as the time period during which all the components are sufficiently melted at the above-defined melting temperature, and selected appropriately depending on the types of the components and the melting temperature. For example, the melting time may be, if not specifically limited to, about 10 minutes to about one hour.

The melted mixture is then cooled down to acquire a glass frit in a solid state. The cooling step hardens the individual melted components to form a solid glass frit. The cooling rate may be controlled appropriately depending on the types of the components of the glass frit. Generally, the fast cooling for the melted mixture is preferable. The specified cooling conditions may be determined with reference to the phase diagram based on the individual components. An extremely low cooling rate may cause crystallization during the cooling step, consequently with the failure to form the glass phase. For example, the melted mixture may be cooled down, if not specifically limited to, at about 25 to about 50° C. for about 1 to about 25 minutes under the atmospheric pressure. As a means for acquiring such a high cooling rate, the typical methods known in the related art may be used, such as, if not specifically limited to, conducting the sheet extrusion of the melted mixture to increase the surface area, or immersion in water.

Subsequently, the solid glass frit is ground into powder. The solid glass frit is too bulky to be blended into a metal paste and thus preferably subjected to comminution into powder. The average particle diameter of the powder after comminution may be, if not specifically limited to, about 1 to about 10 μm. With the particle diameter in the above-defined range, the glass frit can be relatively uniformly dispersed in the metal paste to cause the interface reaction with considerable efficiency. The comminution method for the solid glass frit obtained by the cooling step into powder may include, without limitation, any typical comminution method known in the related art. For efficiency, the comminution process may be carried out in two stages. In this case, the first and second comminution stages may involve a repetition of the same process; otherwise, the first comminution is crushing, and the second comminution is fine-grinding. The term "crushing" as used herein refers to comminution of the solid glass frit to such a particle size adequate to the subsequent fine-grinding method to facilitate the fine-grinding process, rather than limiting the particle size to a given average particle diameter. The term "fine-grinding" as used herein refers to comminution of the crushed glass frit into glass frit powder having a desired average particle diameter. In addition, the individual comminution stages, when necessary, may selectively adopt either dry comminution or wet comminution. As typically known in the related art, the wet comminution may involve adding, if not specifically limited to, water, ethanol, or the like.

Conductive Paste Composition

The conductive paste composition of the present invention comprises a silver (Ag) powder, a lithium titanium oxide, a glass frit, a binder, and a solvent.

Hereinafter, a description in further detail will be given as to the individual ingredients of the conductive paste composition.

In the conductive paste composition of the present invention, silver (Ag) powder is used as a conductive powder to provide electrical characteristics. In the present invention, the silver powder comprises, as well as pure silver powder, silver oxide, silver alloys, silver compounds, or other substances that can be precipitated from the silver powder by firing, which may be used alone or as a mixture of at least two.

The silver powder may be a spherical or flake powder commercially available. Alternatively, the flake powder may be used to prepare a silver powder by a known method.

The particle diameter of the silver powder can be controlled in an appropriate range in consideration of the desired sintering rate or its effect on the formation of an electrode. In accordance with one embodiment of the present invention, the silver powder may have an average particle diameter (d50) in the range of about 0.5 to about 4 μm.

Further, the purity of the silver powder is not specifically limited as long as it meets the typical requirements for electrodes, and may be at least 90%, preferably at least 95%.

The silver powder may be contained in the conductive paste composition of the present invention in an amount of about 60 to about 95 parts by weight, preferably about 70 to about 85 parts by weight, with respect to 100 parts by weight of the conductive paste composition. The content of the silver powder less than 60 parts by weight leads to phase separation or reduced viscosity, causing the problem in printability, while the content of the silver powder greater than 95 parts by weight increases the viscosity, consequently with difficulty in printing and a rise of the cost. Further, the content of the silver powder in the solid powder other than the organic solvent in the paste composition may be 92 to 99 wt % with respect to the total weight of the solid powder.

In accordance with one embodiment of the present invention, the silver powder may be used in a way that its surface is coated with a surfactant. The specific examples of the surfactant applicable to the coating may include, but are not limited to, stearic acid, palmitic acid, lauric acid, oleaic acid, caprilic acid, myristic acid, linoleic acid, and their salts or mixtures.

The conductive paste composition of the present invention comprises a lithium titanium oxide (LTO).

The lithium titanium oxide may be represented by the following formula 1:

$$Li_4Ti_{5-x}M_xO_{12}$$ [Formula 1]

In the formula, x denotes the molar ratio of each component, satisfying $0 \leq x \leq 0.25$; and M is a metal selected from the group consisting of Nb, Zn, Mn, Mg, Fe, Ni, Ca, Bi, Al, Zr, V, Cu, Na, K, and P.

The lithium titanium oxide may be a compound doped with a metal or not. For example, when $0 < x \leq 0.25$ in the formula 1, the lithium titanium oxide is a compound obtained by doping with a metal M.

In accordance with one embodiment of the present invention, the lithium titanium oxide may have an average particle diameter of about 10 to about 500 nm, preferably about 3 to about 200 nm.

The lithium titanium oxide may be obtained by a synthesis method, which is not specifically limited and may include, according to its phase, a gas phase method, a liquid phase method, or a solid phase method.

Among the synthesis methods, the gas phase method involves vaporization of a metal or a metal precursor and then reaction of the gaseous metal or metal precursor with oxide or the like. The gas phase method may be classified into flame combustion pyrolysis, laser vaporization, plasma vaporization, or spray pyrolysis.

The solid phase method includes firing synthesis and mechanochemical synthesis. The firing synthesis is a traditional synthesis method for inorganic particles, which involves long-term pyrolysis and oxidization of a metal precursor in a high-temperature furnace to prepare a metal oxide, recrystallization of the metal oxide, and then comminution of the metal oxide crystals into microparticles. The mechanochemical synthesis is activating the surface of a metal precursor using the mechanical strength with high-speed and high-energy technique, such as by ball milling, to cause a desired reaction.

The liquid phase method includes hydrothermal synthesis and sol-gel synthesis. The hydrothermal synthesis which is most predominantly used as the liquid phase method can prepare the lithium titanium oxide by thermal synthesis using water as a reaction medium or a reactant.

Further, the lithium titanium oxide can be prepared in the form of nano-size ultrafine particles without needing a firing process by continuous reactions of water and an aqueous solution of at least two metal salts under the sub-critical or super-critical conditions.

The conductive paste composition of the present invention comprises a glass frit.

The glass frit is used to effectively form an electrode in a fired pattern deprived of pin holes.

In accordance with one embodiment of the present invention, the glass frit is contained in an amount of about 0.1 to about 10 parts by weight with respect to 100 parts by weight of the paste composition. The content in the above-defined range enables it to maintain low viscosity during the interface reaction, lowers the contact resistance between the substrate and the front surface electrode, and secures considerably high contact strength.

The glass frit comprises at least one selected from the group consisting of $Al_2O_3$, $ZrO_2$, ZnO, and $Li_2O$, in combination with $SiO_2$ and PbO.

In the conductive paste composition of the present invention, $Al_2O_3$, $ZrO_2$, ZnO, and $Li_2O$ included in the glass frit not only form the stable glass phase in the interface reaction but maintain low viscosity. The glass component with low viscosity in the interface reaction increases the possibility of the contact between PbO and the anti-reflection layer, allowing etching to occur in more regions. The more the etching occurs, the wider the region of the front surface electrode formed by recrystallization of silver becomes, leading to a reduced contact resistance between the substrate and the front surface electrode, to enhance the performance of the solar cell and improve the contact strength between the substrate and the front surface electrode.

A further detailed description on the glass frit can be given as above.

The conductive paste composition of the present invention may further comprise a metal oxide as an inorganic additive. The metal oxide can be added to enhance the adhesiveness of the paste composition with the crystalline wafer. The metal oxide added as the inorganic additive can be selected from zinc oxide (ZnO), zirconium oxide ($ZrO_2$), or a mixture of them.

The metal oxide may be included in an amount of about 0.1 to about 10 parts by weight, preferably about 1 to about 5 parts by weight, with respect to 100 parts by weight of the composition. In addition, the average particle diameter (d50) may be in the range of about 500 to about 1,000 nm.

The conductive paste composition of the present invention comprises a binder.

The binder, which functions as a binding material for the individual ingredients prior to a firing of the electrode pattern, can be preferably prepared by suspension polymerization.

The binder may include a resin containing a carboxyl group, such as, for example, a photosensitive resin containing a carboxyl group with or without an ethylene-based unsaturated double bond. More specifically, the binder may include, but are not specifically limited to, a photosensitive resin containing a carboxyl group that is a copolymer of an unsaturated carboxylic acid and a compound having an unsaturated double bond; a photosensitive resin containing a carboxyl group that is a copolymer of an unsaturated carboxylic acid and a compound having an unsaturated double bond in which an ethylene-based unsaturated group is added as a pendant group; or a photosensitive resin containing a carboxyl group that is obtained by reacting a copolymer of an acid anhydride having an unsaturated double bond and a compound having an unsaturated double bond with a compound having a hydroxide group and an unsaturated double bond.

The binder may be contained in an amount of about 1 to about 20 parts by weight with respect to 100 parts by weight of the paste composition. The content of the binder less than 1 part by weight possibly leads to the non-uniform distribution of the binder in the electrode pattern, making it difficult to achieve patterning by selective exposure and development, whereas the content of the binder greater than 20 parts by weight causes pattern collapse during a firing of the electrode and increases the resistance of the electrode due to carbon ash after the firing.

The conductive paste composition of the present invention comprises a solvent.

The solvent can be selected as to dissolve the binder and become well miscible with other additives. The examples of the solvent may include, but are not specifically limited to, α-terpinol, butyl carbitol acetate, texanol, butyl carbitol, di-propylene glycol monomethyl ether, etc.

The solvent may be contained in an amount of about 1 to about 20 parts by weight with respect to 100 parts by weight of the paste composition. The content of the solvent less than 1 part by weight leads to a non-uniform coating of the paste, whereas the content of the solvent greater than 20 parts by weight results in insufficient conductivity of the electrode pattern and deterioration of the adhesion of the electrode with the substrate.

The conductive paste composition of the present invention may further comprise additives, such as a dispersing agent, a thickening agent, a thixotropic agent, a leveling agent, etc. in addition to the aforementioned constitutional ingredients. Under necessity, such additives may be contained in an amount of about 1 to about 20 parts by weight with respect to 100 parts by weight of the paste composition.

The examples of the dispersing agent may include, but are not specifically limited to, DISPERBYK®-180, 110, 996, 997, etc. as produced by BYK.

The examples of the thickening agent may include, but are not specifically limited to, BYK®-410, 411, 420, etc. as produced by BYK.

The examples of the thixotropic agent may include, but are not specifically limited to, ANTI-TERRA®-203, 204, 205, etc. as produced by BYK.

The examples of the leveling agent may include, but are not specifically limited to, BYK®-3932 P, BYK®-378, BYK®-306, BYK®-3440, etc. as produced by BYK.

Solar Cell

The solar cell according to one embodiment of the present invention comprises: a substrate having a first conductivity; an emitter layer having a second conductivity and being formed on the substrate; an anti-reflection layer formed on the emitter layer; a front surface electrode being connected to the emitter layer as passing through the anti-reflection layer and prepared using the conductive paste composition; and a back surface electrode formed on the back surface of the substrate.

FIG. 1 is a cross-section view showing the structure of the solar cell according to one embodiment of the present invention.

Referring to FIG. 1, the solar cell of the present invention comprises: a substrate having a first conductivity; an emitter layer having a second conductivity and being formed on the substrate 1; an anti-reflection layer 3 formed on the emitter layer 2; a front surface electrode 4 being connected to the emitter layer 2 as passing through the anti-reflection layer 3 and prepared using the conductive paste composition; and a back surface electrode 4 formed on the back surface of the substrate 1.

In accordance with one embodiment of the present invention, the substrate 1 is a silicon semiconductor substrate having a first conductivity that may be doped with P type impurities, which are trivalent elements, such as boron (B), gallium (Ga), or indium (In). The silicon may be crystalline silicon, such as monocrystalline silicon or polycrystalline silicon, or amorphous silicon.

The emitter layer 2 has a second conductivity as opposite to the substrate 1 and may be doped with N type impurities, which are elements in Group 5, such as phosphorus (P), arsenic (As), antimony (Sb).

As the substrate 1 and the emitter layer 2 are doped with opposite conductivity type impurities to each other, a P-N junction is formed in the interface between them.

In accordance with one embodiment of the present invention, the emitter layer 2 can have such a high sheet resistance that secures high photoelectric conversion efficiency. For example, the solar cell of the present invention may comprise the emitter layer 2 having a high sheet resistance of about 60 to about 120 Ω/sq.

In accordance with one embodiment of the present invention, the thickness of the emitter layer 2 may be in the range of about 100 to about 500 nm.

The anti-reflection layer 3 passivates the defects on the surface or in the bulk of the emitter layer 2 and reduces the reflectivity of an incident sun light that strikes the front surface of the substrate 1. The passivation of the defects on the emitter layer 2 leads to elimination of sites for recombination of minority carriers to increase the open-circuit voltage Voc of the solar cell. Further, the quantity of light arriving at the region of the P-N junction increases with a decrease in the reflectivity of the sun light, to increase the short-circuit current Isc of the solar cell. In this manner, the anti-reflection layer 3 enhances the photoelectric conversion efficiency as much as an increase in the open-circuit voltage and the short-circuit current of the solar cell.

The anti-reflection layer 3 may have a monolayer structure comprising any one monolayer selected from the group consisting of, if not specifically limited to, silicon nitride layer, hydrogen-containing silicon nitride layer, silicon oxide layer, silicon oxynitride layer, $MgF_2$ layer, ZnS layer, $TiO_2$ layer, and $CeO_2$ layer; or a multilayer structure comprising a combination of at least two of the monolayers. The anti-reflection layer 3 may be formed by vacuum deposition, chemical vapor deposition, spin coating, screen printing, or spray coating. Further, the thickness of the anti-reflection layer 3 may be, if not specifically limited to, about 30 to about 100 nm.

The front surface electrode 4 may be formed using the conductive paste composition of the present invention.

The conductive paste composition comprises a silver (Ag) powder, a lithium titanium oxide, a glass frit, a binder, and a solvent. The detailed description of those ingredients is as specified in the descriptions of the glass frit and the conductive paste composition.

In accordance with one embodiment of the present invention, the conductive paste composition is subjected to screen printing and then heat treatment to form the front surface electrode 4. More specifically, the conductive paste composition is applied to printing with a screen printer and then dried out in an infrared firing furnace at about 250 to about 350° C. for about 0.5 to about 5 minutes. Subsequently, it is fired in the infrared firing furnace at about 600 to about 900° C. for about 1 to about 5 minutes to form the front surface electrode 4. As the silver contained in the paste liquefies at high temperature and then recrystallizes into solid through the firing process, a connection to the emitter layer 2 is formed by punch-through phenomenon that the silver goes through the anti-reflection layer 3 via the glass frit and the lithium titanium oxide.

The back surface electrode 5 is formed on the back surface of the substrate 1 and contains aluminum. For example, aluminum paste is printed on the back surface of the substrate 1 and then subjected to heat treatment to form the back surface electrode 5.

The aluminum contained in the back surface electrode 5 diffuses through the back surface of the substrate 1 to form a back surface field layer in the interface between the back surface electrode 5 and the substrate 1. The formation of the back surface field layer prevents migration of carriers towards the back surface of the substrate 1 and recombination. As the recombination of carriers is inhibited, the open-circuit voltage increases to enhance the efficiency of the solar cell.

The solar cell of the present invention can have an enhanced efficiency by including the front surface electrode prepared using the conductive paste composition having an optimized composition enough to provide low contact resistance.

Hereinafter, the present invention will be described in further detail by way of the following examples, which are given for illustrations only and not intended to limit the scope of the present invention.

EXAMPLES

Preparation of Glass Frit

Preparation Example 1-1

17.0 wt % of $SiO_2$, 8.7 wt % of $Al_2O_3$, 66.0 wt % of PbO, 6.0 wt % of ZnO, 1.7 wt % of $Li_2O$, and 0.6 wt % of $ZrO_2$ were mixed using a ball mill and dried out at 80° C. The mixture was melted at 1,000° C. and then quenched at the room temperature. The dried mixture was crushed by disc milling and fine-ground using a planetary mill to prepare a glass frit (hereinafter, denoted by "G/F-1") having an average particle diameter of 5 μm.

Preparation Example 1-2

The procedures were performed in the same manner as described in Preparation Example 1-1, excepting that 9.3 wt % of $SiO_2$, 2.4 wt % of $Al_2O_3$, 84.5 wt % of PbO, 6.0 wt % of ZnO, and 3.8 wt % of $ZrO_2$ were mixed to prepare a glass frit (hereinafter, denoted by "G/F-2").

The compositions of the glass frits according to the Preparation Examples 1-1 and 1-2 are presented in the following Table 1.

TABLE 1

| | Glass frits | | | | | |
|---|---|---|---|---|---|---|
| | $SiO_2$ | $Al_2O_3$ | PbO | ZnO | $Li_2O$ | $ZrO_2$ |
| Preparation Example 1-1 (G/F-1) | 17.0 | 8.7 | 66.0 | 6.0 | 1.7 | 0.6 |
| Preparation Example 1-2 (G/F-2) | 9.3 | 2.4 | 84.5 | — | — | 3.8 |

Preparation of Lithium Titanium Oxide

Preparation Example 2-1

The hydrothermal method was used to prepare a lithium titanium oxide (hereinafter, denoted by "$Li_4Ti_5O_{12}$-150") having an average particle diameter of 150 nm.

More specifically, of $Li_2CO_3$ and $TiO(OH)_2$ were used as starting materials. $Li_2CO_3$ and $TiO(OH)_2$ at a weight ratio of 1.05:1 ($Li_2CO_3$:$TiO(OH)_2$) were added to 100 g of deionized (DI) water and then mixed in a rotary mill at 100 rpm for 2 hours to prepare a slurry.

The slurry was collected and dried out with a spray drier at 100° C. The dried powder thus obtained was transferred to a high temp furnace for calcination at 750° C. for 5 hours. Then, the powder was blended and ground in a rotary mill for 24 hours. The resultant powder was placed in a high temp firing furnace for sintering at 1,050° C. for 5 hours to prepare crystalline lithium titanium oxide.

Figure 2:
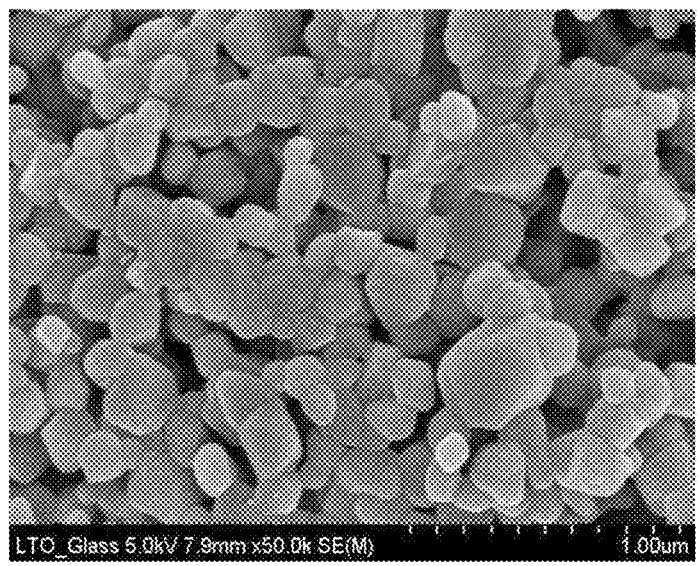
FIG. 2 is an SEM image with a magnification of 50K showing the lithium titanium oxide particles according to the Preparation Example 2-1 of the present invention.

The lithium titanium oxide particles obtained in the Preparation Example 2-1 were measured in regard to the particle diameter using a scanning microscope with a magnification of 50K. The results are shown in FIG. 2. Referring to FIG. 2, it can be seen that lithium titanium oxide particles having an average particle diameter of 150 nm were formed.

Preparation Example 2-2

The procedures were performed in the same manner as described in Preparation Example 2-1, excepting that the powder was ground in a rotary mill at 500 rpm for 4 hours to prepare a lithium titanium oxide (hereinafter, denoted by "$Li_4Ti_5O_{12}$-100") having an average particle diameter of 100 nm.

Preparation Example 2-3

The procedures were performed in the same manner as described in Preparation Example 2-1, excepting that the powder was ground in a rotary mill at 1,000 rpm for 48 hours to prepare a lithium titanium oxide (hereinafter, denoted by "$Li_4Ti_5O_{12}$-30") having an average particle diameter of 30 nm.

Preparation Example 2-4

The procedures were performed in the same manner as described in Preparation Example 2-1, excepting that 0.1 g of $Nb(OH)_5$ was added to prepare a Nb-doped lithium titanium oxide (hereinafter, denoted by "$Li_4Ti_{4.75}Nb_{0.25}O_{12}$-150") having an average particle diameter of 150 nm.

Preparation Example 2-5

The procedures were performed in the same manner as described in Preparation Example 2-1, excepting that 1.0 g of NaOH was added to prepare a Na-doped lithium titanium oxide (hereinafter, denoted by "$Li_4Ti_{4.75}Na_{0.25}O_{12}$-150") having an average particle diameter of 150 nm.

Preparation of Conductive Paste Composition

Example 1

For a silver (Ag) powder, there were used 55.0 wt % of silver particles (4-8F produced by DOWA MINING CO., LTD.) having an average particle diameter (d50) of 2.0 μm and 32.0 wt % of silver particles (2-1C produced by DOWA MINING CO., LTD.) having an average particle diameter (d50) of 0.8 μm.

1.0 wt % of the $Li_4Ti_5O_{12}$-150 as obtained in the Preparation Example 2-1 was used as a lithium titanium oxide.

5.0 wt % of G/F-2 as obtained in the Preparation Example 1-2 was used as a glass frit.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

Example 2

The procedure were performed in the same manner as described in Example 1 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 31.0 wt % of silver particles (2-1C produced by DOWA MINING CO., LTD.) having an average particle diameter (d50) of 0.8 μm; and 2.0 wt % of $Li_4Ti_5O_{12}$-150 as the lithium titanium oxide.

Example 3

The procedure were performed in the same manner as described in Example 1 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 30.0 wt % of silver particles (2-1C produced by DOWA MINING CO., LTD.) having an average particle diameter (d50) of 0.8 μm; and 3.0 wt % of $Li_4Ti_5O_{12}$-150 as the lithium titanium oxide.

Example 4

The procedure were performed in the same manner as described in Example 1 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 29.0 wt % of silver particles (2-1C produced by DOWA MINING CO., LTD.) having an average particle diameter (d50) of 0.8 μm; and 4.0 wt % of $Li_4Ti_5O_{12}$-150 as the lithium titanium oxide.

Example 5

The procedure were performed in the same manner as described in Example 1 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 28.0 wt % of silver particles (2-1C produced by DOWA MINING CO., LTD.) having an average particle diameter (d50) of 0.8 µm; and 5.0 wt % of $Li_4Ti_5O_{12}$-150 as the lithium titanium oxide.

Comparative Example 1

For a silver (Ag) powder, there were used 55.0 wt % of silver particles (4-8F produced by DOWA MINING CO., LTD.) having an average particle diameter (d50) of 2.0 µm and 33.0 wt % of silver particles (2-1C produced by DOWA MINING CO., LTD.) having an average particle diameter (d50) of 0.8 µm.

5.0 wt % of G/F-2 as obtained in the Preparation Example 1-2 was used as a glass frit.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

The constitutional ingredients and the compositions of the paste compositions according to the Examples 1 to 5 and the Comparative Example 1 are presented in the following Table 2.

TABLE 2

| Ingredient | Type | Example (unit: wt %) | | | | | Comparative Example 1 (unit: wt %) |
|---|---|---|---|---|---|---|---|
| | | 1 | 2 | 3 | 4 | 5 | |
| Silver powder | Particles with average particle diameter of 2.0 µm | 55.0 | 55.0 | 55.0 | 55.0 | 55.0 | 55.0 |
| | Particles with average particle diameter of 0.8 µm | 32.0 | 31.0 | 30.0 | 29.0 | 28.0 | 33.0 |
| Lithium titanium oxide | Preparation Example 2-1 ($Li_4Ti_5O_{12}$-150) | 1.0 | 2.0 | 3.0 | 4.0 | 5.0 | 0 |
| Glass frit | Preparation Example 1-2 (G/F-2) | 5.0 | 5.0 | 5.0 | 5.0 | 5.0 | 5.0 |
| Binder | Ethyl cellulose | 2.0 | 2.0 | 2.0 | 2.0 | 2.0 | 2.0 |
| Solvent | BCA | 4.0 | 4.0 | 4.0 | 4.0 | 4.0 | 4.0 |
| Organic additive | Anti-terra 204 | 1.0 | 1.0 | 1.0 | 1.0 | 1.0 | 1.0 |
| Total | | 100 | 100 | 100 | 100 | 100 | 100 |

Example 6

For a silver (Ag) powder, there were used 55.0 wt % of silver particles (4-8F produced by DOWA MINING CO., LTD.) having an average particle diameter (d50) of 2.0 µm and 32.0 wt % of silver particles (2-1C produced by DOWA MINING CO., LTD.) having an average particle diameter (d50) of 0.8 µm.

1.0 wt % of $Li_4Ti_5O_{12}$-150 as obtained in the Preparation Example 2-1 was used as a lithium titanium oxide.

5.0 wt % of the G/F-1 as obtained in the Preparation Example 1-1 was used as a glass frit.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

Example 7

The procedure were performed in the same manner as described in Example 6 to prepare a conductive paste composition, excepting that there were used, as the silver (Ag) powder, 55.0 wt % of silver particles (4-8F produced by DOWA MINING CO., LTD.) having an average particle diameter (d50) of 2.0 µm and 31.0 wt % of silver particles (2-1C produced by DOWA MINING CO., LTD.) having an average particle diameter (d50) of 0.8 µm; and 2.0 wt % of $Li_4Ti_5O_{12}$-150 as the lithium titanium oxide.

Example 8

The procedure were performed in the same manner as described in Example 6 to prepare a conductive paste composition, excepting that there were used, as the silver (Ag) powder, 55.0 wt % of silver particles (4-8F produced by DOWA MINING CO., LTD.) having an average particle diameter (d50) of 2.0 µm and 30.0 wt % of silver particles (2-1C produced by DOWA MINING CO., LTD.) having an average particle diameter (d50) of 0.8 µm; and 3.0 wt % of $Li_4Ti_5O_{12}$-150 as the lithium titanium oxide.

Example 9

The procedure were performed in the same manner as described in Example 6 to prepare a conductive paste composition, excepting that there were used, as the silver (Ag) powder, 55.0 wt % of silver particles (4-8F produced by DOWA MINING CO., LTD.) having an average particle diameter (d50) of 2.0 µm and 29.0 wt % of silver particles (2-1C produced by DOWA MINING CO., LTD.) having an average particle diameter (d50) of 0.8 µm; and 4.0 wt % of $Li_4Ti_5O_{12}$-150 as the lithium titanium oxide.

Example 10

The procedure were performed in the same manner as described in Example 6 to prepare a conductive paste composition, excepting that there were used, as the silver (Ag) powder, 55.0 wt % of silver particles (4-8F produced by DOWA MINING CO., LTD.) having an average particle diameter (d50) of 2.0 µm and 28.0 wt % of silver particles (2-1C produced by DOWA MINING CO., LTD.) having an average particle diameter (d50) of 0.8 µm; and 5.0 wt % of $Li_4Ti_5O_{12}$-150 as the lithium titanium oxide.

The constitutional ingredients and the compositions of the paste compositions according to the Examples 6 to 10 are presented in the following Table 3.

TABLE 3

| Ingredient | Type | Example (unit: wt %) | | | | |
|---|---|---|---|---|---|---|
| | | 6 | 7 | 8 | 9 | 10 |
| Silver powder | Particles with average particle diameter of 2.0 μm | 55.0 | 55.0 | 55.0 | 55.0 | 55.0 |
| | Particles with average particle diameter of 0.8 μm | 32.0 | 31.0 | 30.0 | 29.0 | 28.0 |
| Lithium titanium oxide | Preparation Example 2-1 ($Li_4Ti_5O_{12}$-150) | 1.0 | 2.0 | 3.0 | 4.0 | 5.0 |
| Glass frit | Preparation Example 1-1 (G/F-1) | 5.0 | 5.0 | 5.0 | 5.0 | 5.0 |
| Binder | Ethyl cellulose | 2.0 | 2.0 | 2.0 | 2.0 | 2.0 |
| Solvent | BCA | 4.0 | 4.0 | 4.0 | 4.0 | 4.0 |
| Organic additive | Anti-terra 204 | 1.0 | 1.0 | 1.0 | 1.0 | 1.0 |
| Total | | 100 | 100 | 100 | 100 | 100 |

Example 11

For a silver (Ag) powder, there were used 55.0 wt % of silver particles (4-8F produced by DOWA MINING CO., LTD.) having an average particle diameter (d50) of 2.0 μm and 30.0 wt % of silver particles (2-1C produced by DOWA MINING CO., LTD.) having an average particle diameter (d50) of 0.8 μm.

2.0 wt % of $Li_4Ti_5O_{12}$-150 as obtained in the Preparation Example 2-1 and 1.0 wt % of $Li_4Ti_5O_{12}$-30 as obtained in the Preparation Example 2-3 were used as lithium titanium oxides.

5.0 wt % of the G/F-1 as obtained in the Preparation Example 1-1 was used as a glass frit.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

Example 12

The procedure were performed in the same manner as described in Example 11 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 31.0 wt % of silver particles (2-1C produced by DOWA MINING CO., LTD.) having an average particle diameter (d50) of 0.8 μm; and 2.0 wt % of $Li_4Ti_5O_{12}$-100 of the Preparation Example 2-2 as the lithium titanium oxide.

Example 13

The procedure were performed in the same manner as described in Example 11 to prepare a conductive paste composition, excepting that there were used, as the silver (Ag) powder, 55.0 wt % of silver particles (4-8F produced by DOWA MINING CO., LTD.) having an average particle diameter (d50) of 2.0 μm and 31.0 wt % of silver particles (2-1C produced by DOWA MINING CO., LTD.) having an average particle diameter (d50) of 0.8 μm; and 2.0 wt % of $Li_4Ti_5O_{12}$-30 of the Preparation Example 2-3 as the lithium titanium oxide.

The constitutional ingredients and the compositions of the paste compositions according to the Examples 11, 12, and 13 are presented in the following Table 4.

TABLE 4

| Ingredient | Type | Example (unit: wt %) | | |
|---|---|---|---|---|
| | | 11 | 12 | 13 |
| Silver powder | Particles with average particle diameter of 2.0 μm | 55.0 | 55.0 | 55.0 |
| | Particles with average particle diameter of 0.8 μm | 30.0 | 31.0 | 31.0 |
| Lithium titanium oxide | Preparation Example 2-1 ($Li_4Ti_5O_{12}$-150) | 2.0 | — | — |
| | Preparation Example 2-2 ($Li_4Ti_5O_{12}$-100) | — | 2.0 | — |
| | Preparation Example 2-3 ($Li_4Ti_5O_{12}$-30) | 1.0 | — | 2.0 |
| Glass frit | Preparation Example 1-1 (G/F-1) | 5.0 | 5.0 | 5.0 |
| Binder | Ethyl cellulose | 2.0 | 2.0 | 2.0 |
| Solvent | BCA | 4.0 | 4.0 | 4.0 |
| Organic additive | Anti-terra 204 | 1.0 | 1.0 | 1.0 |
| Total | | 100.0 | 100.0 | 100.0 |

Example 14

For a silver (Ag) powder, there were used 55.0 wt % of silver particles (4-8F produced by DOWA MINING CO., LTD.) having an average particle diameter (d50) of 2.0 μm and 28.0 wt % of silver particles (2-1C produced by DOWA MINING CO., LTD.) having an average particle diameter (d50) of 0.8 μm.

2.0 wt % of $Li_4Ti_5O_{12}$-150 as obtained in the Preparation Example 2-1 and 1.0 wt % of $Li_4Ti_5O_{12}$-30 as obtained in the Preparation Example 2-3 were used as lithium titanium oxides.

5.0 wt % of the G/F-1 as obtained in the Preparation Example 1-1 was used as a glass frit.

2.0 wt % of ZnO was used as an inorganic additive.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

Example 15

The procedure were performed in the same manner as described in Example 14 to prepare a conductive paste composition, excepting that 2.0 wt % of $ZrO_2$ was used as the inorganic additive.

Example 16

The procedure were performed in the same manner as described in Example 14 to prepare a conductive paste composition, excepting that 1.0 wt % of ZnO and 1.0 wt % of $ZrO_2$ were used as the inorganic additives.

The constitutional ingredients and the compositions of the paste compositions according to the Examples 14, 15, and 16 are presented in the following Table 5.

TABLE 5

| Ingredient | Type | Example (unit: wt %) | | |
|---|---|---|---|---|
| | | 14 | 15 | 16 |
| Silver powder | Particles with average particle diameter of 2.0 μm | 55.0 | 55.0 | 55.0 |
| | Particles with average particle diameter of 0.8 μm | 28.0 | 28.0 | 28.0 |
| Lithium titanium oxide | Preparation Example 2-1 ($Li_4Ti_5O_{12}$-150) | 2.0 | 2.0 | 2.0 |
| | Preparation Example 2-2 ($Li_4Ti_5O_{12}$-100) | — | — | — |
| | Preparation Example 2-3 ($Li_4Ti_5O_{12}$-30) | 1.0 | 1.0 | 1.0 |
| Inorganic additive | ZnO | 2.0 | — | 1.0 |
| | $ZnO_2$ | — | 2.0 | 1.0 |
| Glass frit | Preparation Example 1-1 (G/F-1) | 5.0 | 5.0 | 5.0 |
| Binder | Ethyl cellulose | 2.0 | 2.0 | 2.0 |
| Solvent | BCA | 4.0 | 4.0 | 4.0 |
| Organic additive | Anti-terra 204 | 1.0 | 1.0 | 1.0 |
| Total | | 100.0 | 100.0 | 100.0 |

Example 17

For a silver (Ag) powder, there were used 55.0 wt % of silver particles (4-8F produced by DOWA MINING CO., LTD.) having an average particle diameter (d50) of 2.0 μm and 29.0 wt % of silver particles (2-1C produced by DOWA MINING CO., LTD.) having an average particle diameter (d50) of 0.8 μm.

2.0 wt % of $Li_4Ti_{4.75}Nb_{0.25}O_{12}$-150 as obtained in the Preparation Example 2-4 was used as a lithium titanium oxide.

For a glass frit, 5.0 wt % of G/F-1 as obtained in the Preparation Example 1-1 was used.

1.0 wt % of ZnO and 1.0 wt % of $ZrO_2$ were used as inorganic additives.

Further, 2.0 wt % of ethyl cellulose (Std 10 produced by DOW) as a binder, 4.0 wt % of butyl carbitol acetate (BCA) as a solvent, and 1.0 wt % of a thixotropic agent (Anti-terra 204 produced by BYK) as an additive were blended to prepare a conductive paste composition.

Example 18

The procedure were performed in the same manner as described in Example 17 to prepare a conductive paste composition, excepting that 2.0 wt % of $Li_4Ti_{4.75}Na_{0.25}O_{12}$-150 as obtained in the Preparation Example 2-5 was used as the lithium titanium oxide.

The constitutional ingredients and the compositions of the paste compositions according to the Examples 17 and 18 are presented in the following Table 6.

TABLE 6

| Ingredient | Type | Example (unit: wt %) | |
|---|---|---|---|
| | | 17 | 18 |
| Silver powder | Particles with average particle diameter of 2.0 μm | 55.0 | 55.0 |
| | Particles with average particle diameter of 0.8 μm | 29.0 | 29.0 |
| Lithium titanium oxide | Preparation Example 2-4 ($Li_4Ti_{4.75}Nb_{0.25}O_{12}$-150) | 2.0 | — |
| | Preparation Example 2-5 ($Li_4Ti_{4.75}Na_{0.25}O_{12}$-150) | — | 2.0 |
| Inorganic additive | ZnO | 1.0 | 1.0 |
| | $ZnO_2$ | 1.0 | 1.0 |
| Glass frit | Preparation Example 1-1 (G/F-1) | 5.0 | 5.0 |
| Binder | Ethyl cellulose | 2.0 | 2.0 |
| Solvent | BCA | 4.0 | 4.0 |
| Organic additive | Anti-terra 204 | 1.0 | 1.0 |
| Total | | 100.0 | 100.0 |

Fabrication of Solar Cell

Example 19

A 156 mm polycrystalline silicon wafer was doped with phosphorus (P) through a diffusion process using $POCL_3$ at 900° C. in a tube furnace to form an emitter layer having a sheet resistance of 100 Ω/sq.

On the emitter layer was deposited a silicon nitride layer by PECVD to form an 80 nm-thick anti-reflection layer.

An aluminum paste (ALSOLAR® produced by Toyo Aluminum K. K) was used to screen-print the back surface of the wafer. Subsequently, the aluminum paste was dried out in a belt firing furnace at 300° C. for 60 seconds and then sintered in the belt firing furnace at 900° C. for 60 seconds to form a back surface electrode. The thickness of the back surface electrode formed after the sintering process was about 30 μm.

The conductive paste composition obtained in the Example 1 was used to screen-print the surface of the anti-reflection layer with a screen printer and then dried out in an infrared firing furnace at 180° C. for one minute. Subsequently, a firing process was conducted with the infrared firing furnace at a temperature of 600 to 900° C. for 1 to 5 minutes to form a front surface electrode.

Examples 20 to 36

The procedures were performed in the same manner as described in Example 19 to fabricate a solar cell, excepting that the conductive paste compositions of the Examples 2 to 18 were used, respectively, to form a front surface electrode.

Comparative Example 2

The procedures were performed in the same manner as described in Example 19 to fabricate a solar cell, excepting that the conductive paste composition of the Comparative Example 1 was used to form a front surface electrode.

Evaluation of Electrical Performance

The solar cells fabricated in the Examples 19 to 36 and the Comparative Example 2 were measured in regard to the electrical performances with Model NCT-M-180A manufactured by NPC Inc. (Dumont N.J., U.S.A.) under the AM 1.5 solar condition according to the ASTM G-173-03.

The results are presented in the following Table 7, where Jsc means the short-circuit current density measured at zero output voltage; Voc means the open-circuit voltage measured at zero output voltage; FF (%) means the fill factor; and Eta (%) means the efficiency.

TABLE 7

|  | Eta (%) | Jsc (mA/cm$^2$) | Voc (V) | FF (%) |
| --- | --- | --- | --- | --- |
| Example 19 | 13.80 | 34.58 | 0.61 | 65.61 |
| Example 20 | 14.10 | 34.48 | 0.61 | 66.57 |
| Example 21 | 15.30 | 34.49 | 0.61 | 72.40 |
| Example 22 | 13.92 | 34.58 | 0.61 | 65.61 |
| Example 23 | 14.09 | 34.91 | 0.61 | 65.92 |
| Example 24 | 16.53 | 34.43 | 0.61 | 77.34 |
| Example 25 | 16.45 | 35.25 | 0.61 | 76.11 |
| Example 26 | 16.69 | 35.04 | 0.62 | 76.99 |
| Example 27 | 16.20 | 34.17 | 0.62 | 76.77 |
| Example 28 | 16.18 | 34.17 | 0.62 | 76.65 |
| Example 29 | 16.70 | 35.05 | 0.62 | 76.80 |
| Example 30 | 16.64 | 35.18 | 0.62 | 76.39 |
| Example 31 | 16.54 | 35.03 | 0.62 | 76.08 |
| Example 32 | 16.70 | 34.98 | 0.62 | 77.40 |
| Example 33 | 16.70 | 34.94 | 0.62 | 77.50 |
| Example 34 | 16.80 | 34.92 | 0.62 | 78.91 |
| Example 35 | 17.10 | 35.40 | 0.62 | 77.80 |
| Example 36 | 17.20 | 35.52 | 0.62 | 77.90 |
| Comparative Example 2 | 8.72 | 34.38 | 0.61 | 43.96 |

As can be seen from Table 7, the solar cells of the Examples 19 to 36 using the conductive paste compositions of the present invention had considerable enhancement in efficiency and fill factor in comparison with the solar cell of the Comparative Example 2.

What is claimed is:

1. A conductive paste composition comprising a silver (Ag) powder, a lithium titanium oxide, a glass frit, a binder, and a solvent, wherein the glass frit comprises SiO2, PbO, and at least one selected from the group consisting of Al2O3, ZrO2, ZnO, and Li$_2$O, wherein the lithium titanium oxide is a compound represented by the following formula 1:

Li$_4$Ti$_{5-x}$M$_x$O$_{12}$     [Formula 1]

wherein x denotes the molar ratio of each component, satisfying 0≤x≤0.25; and M is a metal selected from the group consisting of Nb, Zn, Mn, Mg, Fe, Ni, Ca, Bi, Al, Zr, V, Cu, Na, and K.

2. The conductive paste composition as claimed in claim 1, wherein the conductive paste composition comprises, with respect to 100 parts by weight of the paste composition, 60 to 95 parts by weight of the silver powder, 0.1 to 10 parts by weight of the glass frit, 0.1 to 5 parts by weight of the lithium titanium oxide, 1 to 20 parts by weight of the binder, and 1 to 20 parts by weight of the solvent.

3. The conductive paste composition as claimed in claim 1, wherein the lithium titanium oxide has an average particle diameter of 10 to 500 nm.

4. The conductive paste composition as claimed in claim 1, wherein the conductive paste composition further comprises at least one metal oxide selected from the group consisting of ZnO, ZrO2, and a mixture thereof.

5. The conductive paste composition as claimed in claim 2, wherein the conductive paste composition further comprises 0.1 to 10 parts by weight of at least one metal oxide selected from the group consisting of ZnO, ZrO2, and a mixture thereof.

6. The conductive paste composition as claimed in claim 1, wherein the silver powder is a spherical or flake powder having an average particle diameter of 0.5 to 4 μm.

7. The conductive paste composition as claimed in claim 1, wherein the binder includes at least one photosensitive resin containing a carboxyl group selected from the group consisting of a photosensitive resin containing a carboxyl group as a copolymer of an unsaturated carboxylic acid and a compound having an unsaturated double bond, a photosensitive resin containing a carboxyl group as a copolymer of an unsaturated carboxylic acid and a compound having an unsaturated double bond, wherein the copolymer has an ethylene-based unsaturated group added as a pendant group, and a photosensitive resin containing a carboxyl group as obtained by reacting a copolymer of an acid anhydride having an unsaturated double bond and a compound having an unsaturated double bond with a compound having a hydroxide group and an unsaturated double bond.

8. The conductive paste composition as claimed in claim 1, wherein the solvent includes at least one selected from α-terpinol, butyl carbitol acetate, texanol, butyl carbitol, and di-propylene glycol monomethyl ether.

9. The conductive paste composition as claimed in claim 2, wherein the conductive paste composition further comprises 0.1 to 10 parts by weight of at least one additive selected from the group consisting of a dispersing agent, a thickening agent, a thixotropic agent, and a leveling agent.

* * * * *